United States Patent [19]
Kelly

[11] Patent Number: 5,071,670
[45] Date of Patent: Dec. 10, 1991

[54] METHOD FOR CHEMICAL VAPOR DEPOSITION UNDER A SINGLE REACTOR VESSEL DIVIDED INTO SEPARATE REACTION CHAMBERS EACH WITH ITS OWN DEPOSITING AND EXHAUSTING MEANS

[76] Inventor: Michael A. Kelly, 121 Erica Way, Portola Valley, Calif. 94028

[21] Appl. No.: 535,888

[22] Filed: Jun. 11, 1990

[51] Int. Cl.⁵ .............................................. B05D 3/06
[52] U.S. Cl. ........................................ 427/38; 427/55; 427/70; 427/255.3; 427/255.5; 427/314; 427/402; 118/319
[58] Field of Search ................... 427/70, 255.7, 255.2, 427/255.5, 38, 55, 255.3, 314, 402; 118/719, 319, 723

[56] References Cited

U.S. PATENT DOCUMENTS

| | | | |
|---|---|---|---|
| 4,438,723 | 3/1984 | Cannello et al. ................ | 118/718 |
| 4,490,229 | 12/1984 | Mirtich et al. . | |
| 4,539,933 | 9/1985 | Campbell et al. . | |
| 4,545,327 | 10/1985 | Campbell et al. . | |
| 4,622,919 | 11/1986 | Suzuki et al. . | |
| 4,664,743 | 5/1987 | Moss et al. . | |
| 4,767,608 | 8/1988 | Matsumoto et al. . | |
| 4,777,908 | 10/1988 | Temple et al. . | |
| 4,824,454 | 4/1989 | Arnold et al. ................ | 204/298 |
| 4,830,702 | 5/1989 | Singh et al. . | |
| 4,851,256 | 7/1989 | Matsuyama et al. . | |
| 4,859,493 | 8/1989 | Lemelson . | |
| 4,868,003 | 9/1989 | Temple et al. . | |
| 4,869,924 | 9/1989 | Ito . | |
| 4,874,631 | 10/1989 | Jacobson et al. .................... | 427/39 |
| 4,882,138 | 11/1989 | Pinneo . | |
| 4,910,041 | 3/1990 | Yanagihara et al. ............... | 427/37 |
| 4,915,977 | 8/1990 | Okamoto et al. . | |

*Primary Examiner*—Shrive Beck
*Assistant Examiner*—Benjamin L. Utech
*Attorney, Agent, or Firm*—David B. Harrison

[57] ABSTRACT

A method provides a sequential continuous vapor deposition process comprising a plurality of steps for depositing a predetermined material upon a surface of a substrate mounted for relative movement within a reactor vessel between each of a plurality of gas emitters disposed within the vessel for separately and continuously emitting predetermined gases, each gas emitter having an exhaust port associated therewith for exhausting the said gas emitted by the said gas emitter from the reactor vessel, the method comprising the steps of: separating each of the plurality of gases within the reactor vessel by establishing pressure differences at each of said gas emitters, moving the substrate to pass immediately adjacent to a first one of said plurality of gas emitters for exposing the substrate to a first one of said gases in order to carry out a first step of the vapor deposition process and, moving the substrate to pass immediately adjacent to a second one of said plurality of gas emitters for exposing the substrate to a second one of said gases to carry out a second step of the vapor deposition process, so that the steps of the vapor deposition process are carried out sequentially by moving the substrate among the plurality of gas emitters.

22 Claims, 4 Drawing Sheets

METHOD FOR CHEMICAL VAPOR DEPOSITION UNDER A SINGLE REACTOR VESSEL DIVIDED INTO SEPARATE REACTION CHAMBERS EACH WITH ITS OWN DEPOSITING AND EXHAUSTING MEANS

FIELD OF THE INVENTION

The present invention relates to a method for growing materials on a surface by subjecting that surface to a rapid sequence of different chemical environments which are physically separated from each other such that the sequence defines a multi-step process resulting in growth of a layer of the desired material.

BACKGROUND OF THE INVENTION

Chemical vapor deposition (CVD) is a widely used method for growing materials on surfaces within a gaseous environment. CVD involves exposing some solid surface (substrate) to an environment consisting of gases which react with the substrate to form a desired layer of new material composed in part of the elements present in the gases. In this manner, metals may be deposited on semiconductors, polymeric materials may be deposited on metals, and many other practical coatings or overlayers may be so produced. Often it is also necessary to supply energy in the form of heat or plasma excitation in order to assist the deposition process.

While CVD is widely understood and employed in a myriad of useful applications, it is difficult or impossible to grow some materials by conventional CVD techniques if their formation requires gases that are not compatible with each other. For example, it may not be possible to produce a material which requires both hydrogen and oxygen in the formation process because the hydrogen may combine with the oxygen in the gas so rapidly that the desired reaction may be inhibited.

Also, if forming a layer of a specific material requires several chemical reactions in a specific sequence, a single gas environment may result in undesirable out-of-sequence chemical reactions. One immediately apparent solution to this problem would be to transport the substrate from one CVD chamber to another in order to produce the desired sequence of reactions or to eliminate the undesired competitive reactions. However, unless this can be done very rapidly, unwanted reactions or other changes in the surface may occur during the transit time, and the overall time required to grow the desired thickness of material will be prohibitively long. Similarly, sequentially introducing different gases into a single chamber requires either an unacceptable amount of time or an imperfect exchange, so one gas environment contaminates the next.

U.S. Pat. No. 4,664,743 to Moss et al. describes a sequential film growing method by proposing to transport the substrate between a plurality of physically separated environments, each of which is needed to grow a particular material. With the Moss et al. approach, it is possible to produce layers of different materials by moving the substrate from one environment to the other to enable sequential exposure to at least two gas flows. However, the Moss et al. approach is limited to growing only those materials which are capable of being grown in a single gas environment. Also, Moss et al. make no provision for excitation of the different gas environments.

U.S. Pat. No. 4,622,919 to Suzuki et al. teaches film growth by sequential vapor deposition, not CVD. While Suzuki teaches plural gas environments within a reaction vessel, it is not understood how the Suzuki et al. devices would be able to keep the different gas environments separate within the reactor, and would require very high vacuum conditions in which the atoms suffered few collisions between the source and the substrate.

While diamond films may be grown by conventional CVD techniques using mixtures of hydrogen and methane in an electrical discharge, these conventional techniques have required that the substrate be heated to approximately 800° C. This temperature is too hot to provide useful coatings on most materials because of the resultant thermal damage to the substrate. Thus, one hitherto unsolved need has been for a sequential CVD process for growing diamond coatings at lower process temperatures.

SUMMARY OF THE INVENTION WITH OBJECTS

A general object of the present invention is to provide a method for growing materials by CVD which rapidly presents a sequence of effectively separate gaseous environments to the substrate in a manner which overcomes limitations and drawbacks of the prior art approaches.

A more specific object of the present invention is to provide a sequential CVD process in which otherwise incompatible reactions are made to occur one-at-a-time in effectively physically separate environmental areas of a reactor vessel.

Another specific object of the present invention is to provide a method for growing a single layer of atoms of a new material upon a substrate by a CVD process which rapidly presents a sequence of effectively separate gaseous environments to the substrate.

A further specific object of the present invention is to provide a sequential CVD process which is capable of providing distinct excitation conditions in each process environment.

One more specific object of the present invention is to provide a sequential CVD process in which the gases of effectively separate environments are excited as to cause positively or negatively charged species to preferentially strike the substrate so as to permit more selective reactions to occur.

Yet another specific object of the present invention is to provide a method for growing diamond films on substrates at lower process temperatures than heretofore realized.

In accordance with the principles of the present invention a plurality of effectively separate gaseous environments are provided within a single sequential CVD reaction vessel or chamber. The effective separation of the plural environments is maintained by preferential gas flow from sources positioned sequentially adjacent to the substrate. The rate of gas flow from each of the sources is made large in comparison to time required for diffusion between the plural sources. While the moving substrate may carry a small amount of gas from a former environment to a successor environment the vessel due to gas stagnation near its surface, the gas so moved either will be too small to cause problems, or it will be purged by movement through an intermediate purging environment.

Preferably, each effectively separate environment within the reaction vessel may be electrically excited by the application of direct current, radio frequency or microwave radiation to produce the amount of energy or ionized species appropriate to the desired reaction.

Also, the gases of the separate environments within the vessel may be excited in such a way as to cause positively or negatively charged species preferentially to strike the substrate. This aspect of the invention is implemented by providing an exciting source which is biased with respect to the substrate in an appropriate manner (positive or negative) and results in the occurrence of more selective reactions.

A method of the present invention provides a sequential continuous vapor deposition process comprising a plurality of steps for depositing a predetermined material upon a surface of a substrate mounted for relative movement within a reactor vessel between each of a plurality of gas emitters disposed within the vessel for separately and continuously emitting predetermined gases, each gas emitter having an exhaust port associated therewith for exhausting the said gas emitted by the said gas emitter from the reactor vessel, the method comprising the steps of:

separating each of the plurality of gases within the reactor vessel by establishing pressure differences at each of said gas emitters, moving the substrate to pass immediately adjacent to a first one of said plurality of gas emitters for exposing the substrate to a first one of said gases in order to carry out a first step of the vapor deposition process, and moving the substrate to pass immediately adjacent to a second one of said plurality of gas emitters for exposing the substrate to a second one of said gases to carry out a second step of the vapor deposition process, so that the steps of the vapor deposition process are carried out sequentially by moving the substrate among the plurality of gas emitters.

These and other objects, aspects, advantages and features of the present invention will be more fully understood and appreciated by those skilled in the art upon consideration of the following detailed description of preferred embodiments, presented in conjunction with the accompanying drawings.

DETAILED DESCRIPTION OF PREFERRED EMBODIMENTS

Figure 1:
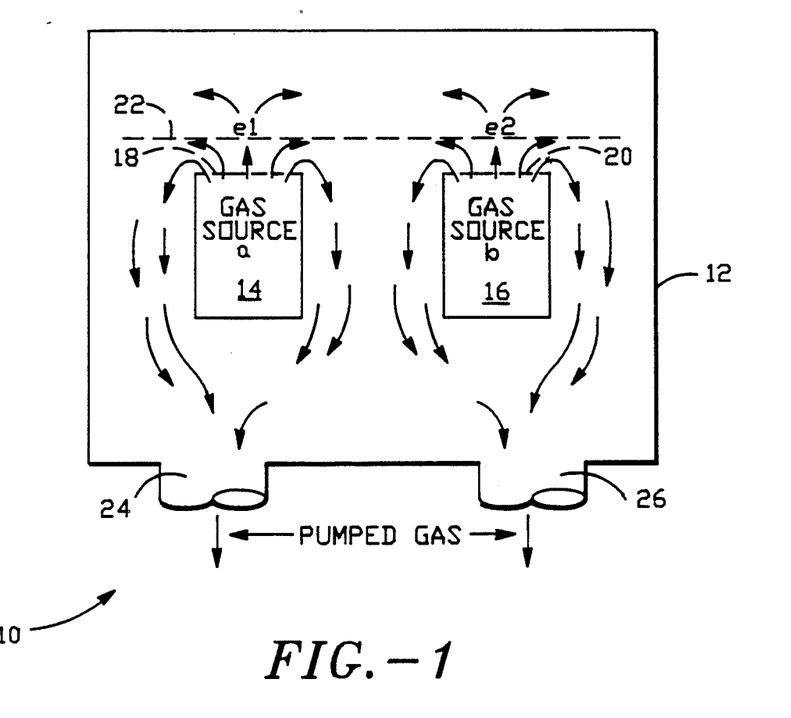
FIG. 1 is a diagrammatic view of a sequential CVD chamber in accordance with the principles of the present invention in which plural gas environments are effectively separated from each other by preferential gas flow.

With reference to FIG. 1, apparatus 10 for sequential CVD in accordance with the present invention includes a reaction-containing pressure vessel 12 which is evacuated by a vacuum pump (not shown) to a predetermined desired low pressure level. Two gas sources 14 and 16 are contained within the interior of the vessel 12 and direct their respectively different gases upwardly through gas emission plates 18 and 20 toward a substrate locus 22. Gas flow is denoted by the arrows in FIG. 1. Gas emitted from the emission plate 18 of the source 14 is exhausted through a pumped exhaust port 24, and gas emitted from the emission plate 20 of the source 16 is exhausted through a second pumped exhaust port 26.

By making the rate of gas flow from the sources 14 and 16 large compared with time required for intermixture by diffusion of the gases from the sources 14 and 16, the gas environment regions e1 and e2 will have gas compositions almost identical to their respective sources 14 and 16. Hence, if a substrate 28 to be coated is rapidly moved from the environment e1 adjacent to the gas source 14 to the environment e2 adjacent to the gas source 16 along the substrate locus 22, the substrate 28 will be subjected sequentially to two distinct gaseous environments within the same vessel 12 and without any solid physical barriers between the two environments e1 and e2.

The substrate 28 moving between the environments will carry a small amount of the gas emitted by the emitter 14, because of gas stagnation adjacent to the substrate surface. However, in many cases the quantity of gas from the e1 environment will be too small to cause problems. If problems are detected or suspected, a purging environment of inert gas (not shown) may be provided between the sources 14 and 16 to remove the vestiges of the e1 environment gas from the vicinity of the substrate surface.

Figure 2:
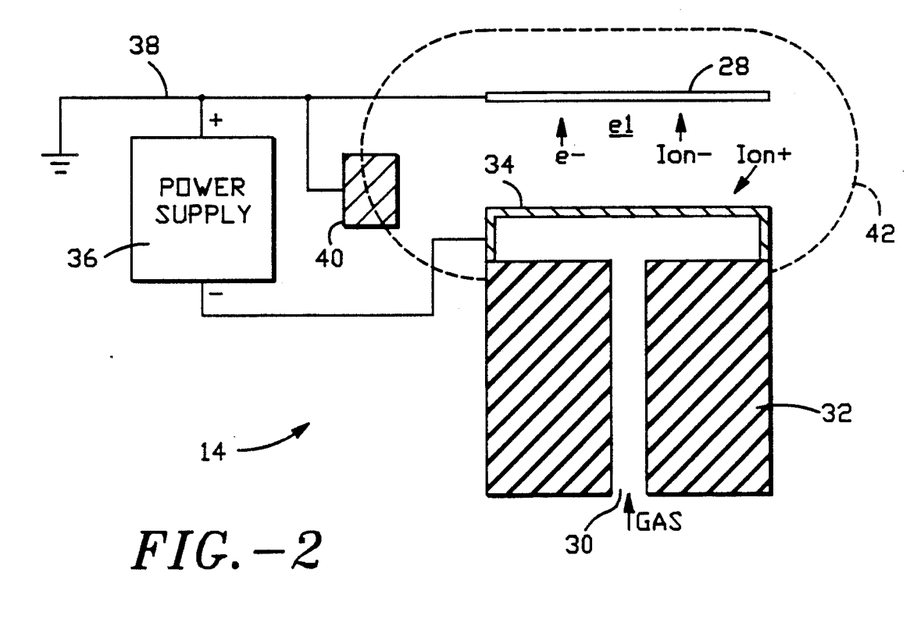
FIG. 2 is a diagrammatic view of a gas source for use within the FIG. 1 CVD chamber which produces and directs negative particles and excited neutral species towards the substrate.

With reference to FIG. 2 the gas emitter 14 is shown in one preferred form of structural detail. In this preferred embodiment of the gas emitter 14, negative particles or negatively excited neutral species of deposition material are directed toward the substrate. The emitter 14 includes a gas conduit 30 for the gas providing the e1 environment which is rich in free electrons and negative ions of the desired element or compound in the gas. The conduit 30 leads through a dielectric insulator structure 32 and through a porous metal electrode 34. The metal electrode 34 is given a negative charge relative to the substrate by virtue of a power supply 36 having its negative lead connected to the porus metal electrode 34 and its positive lead 38 connected to the substrate 28. An anode 40 is also connected to the positive lead 38 and directs the free electrons and negative gas ions toward the substrate. Because of the electric field provided by the power supply 36, a plasma discharge surrounds the porus metal electrode 34, anode 40 and substrate 28, as denoted by the dashed line in FIG. 2.

As noted above, one aspect of this invention is to provide distinct excitation conditions to each separate gaseous environment. In order to make desired particular CVD reactions to occur, it is frequently necessary to excite the gas in an electrical discharge to provide energy and create ionic species in the vicinity of the substrate. Accordingly, each environment may be electrically excited by application of direct current as in FIG. 2, or by radio frequency energy or microwave energy in such levels as to produce the amount of excitation energy or ionization appropriate to the desired reaction.

Figure 3:
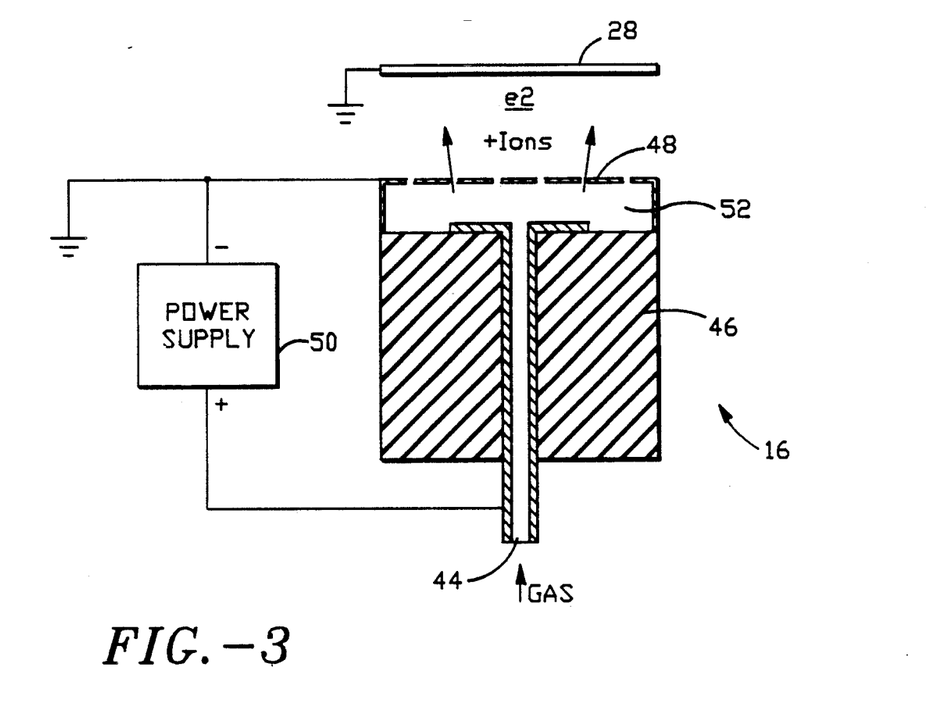
FIG. 3 is a diagrammatic view of a gas source for use within the FIG. 1 CVD chamber which produces and directs positive ions and excited neutral species toward the substrate.

FIG. 3 depicts an embodiment of the gas emitter 16 adapted to produce positive ions or positively excited neutral species. Gas containing desired elements or components needed for the coating being applied to the substrate 28 is delivered through a conduit 44. In this example, the conduit 44 also provides a positive anode and directs the gas through an insulator 46 to an emission site comprising a metal screen 48. A power supply 50 applies a positive bias voltage to the conduit 44 relative to the metal screen 48 and the substrate 28. A plasma discharge 52 results in the space between the anode emitter 44 and the metal screen 48. Positive ions are directed through the screen and toward the substrate 28, thereby creating a desired environment e2, for example. While negative and positive environments el and el are illustrated, it is to be understood that these are illustrative examples only, and that in practice other environments may be found to be efficacious and developed by following the principles of the present invention.

Figure 4A:
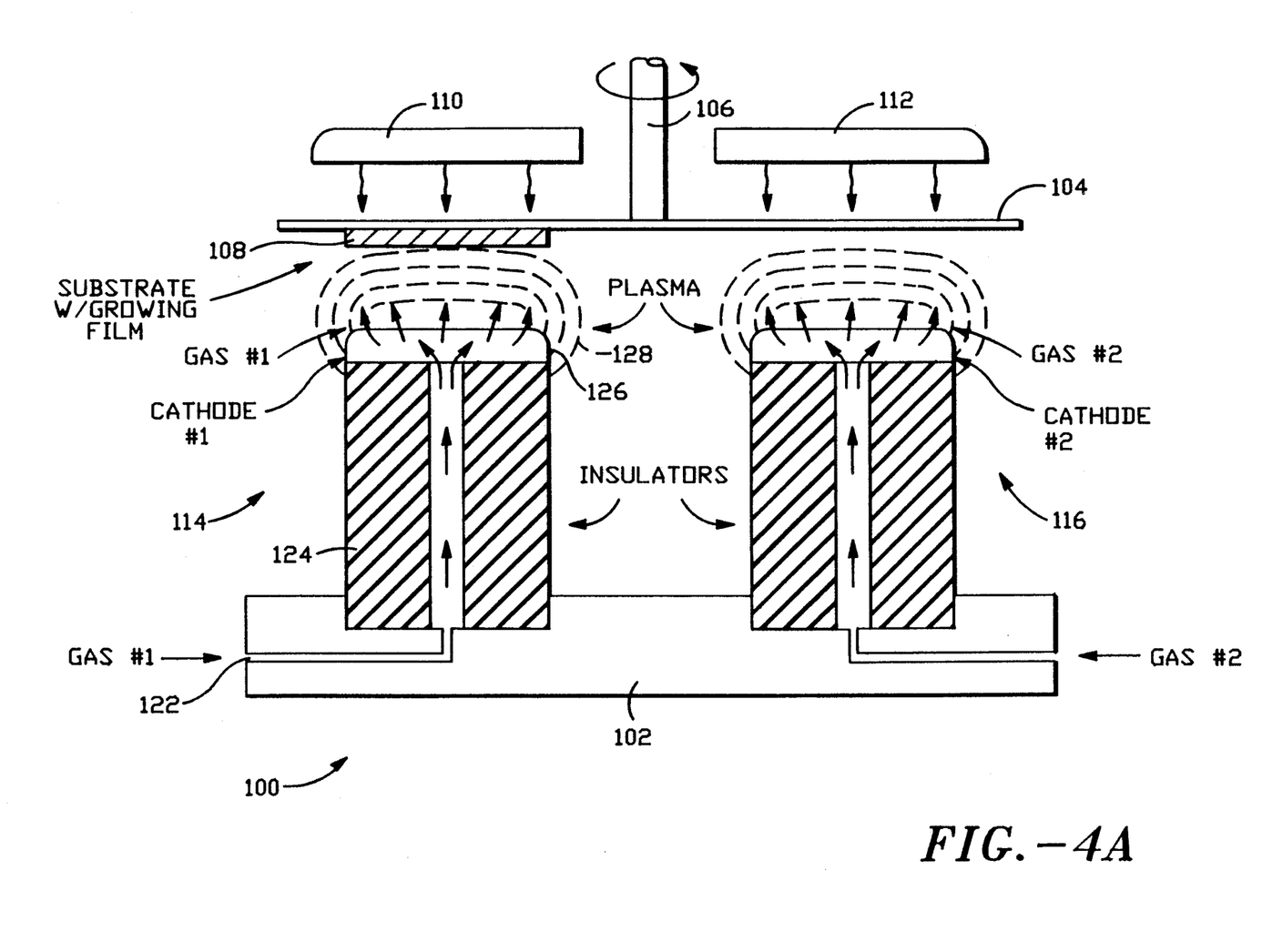
FIG. 4A is a somewhat diagrammatic side view in elevation of one implementation of the FIG. 1 sequential CVD apparatus, showing relative positioning of two of four cathodes within the CVD chamber.

FIG. 4A depicts sequential CVD process apparatus 100 also implementing principles of the present invention. The apparatus 100 includes a pumped pressure vessel 102 the base element of which being depicted in FIG. 4A). A rotating substrate plate 104 is rotated by a shaft 106 in a direction depicted by the arrow extending around the shaft. A substrate 108 is mounted to the lower major surface of the plate 104, as perhaps best seen in FIG. 4B. Heater elements 110 and 112 selectively apply heat to the substrate 108 at each one of plural cathode positions as may be required by the particular sequential CVD process.

Figure 4B:
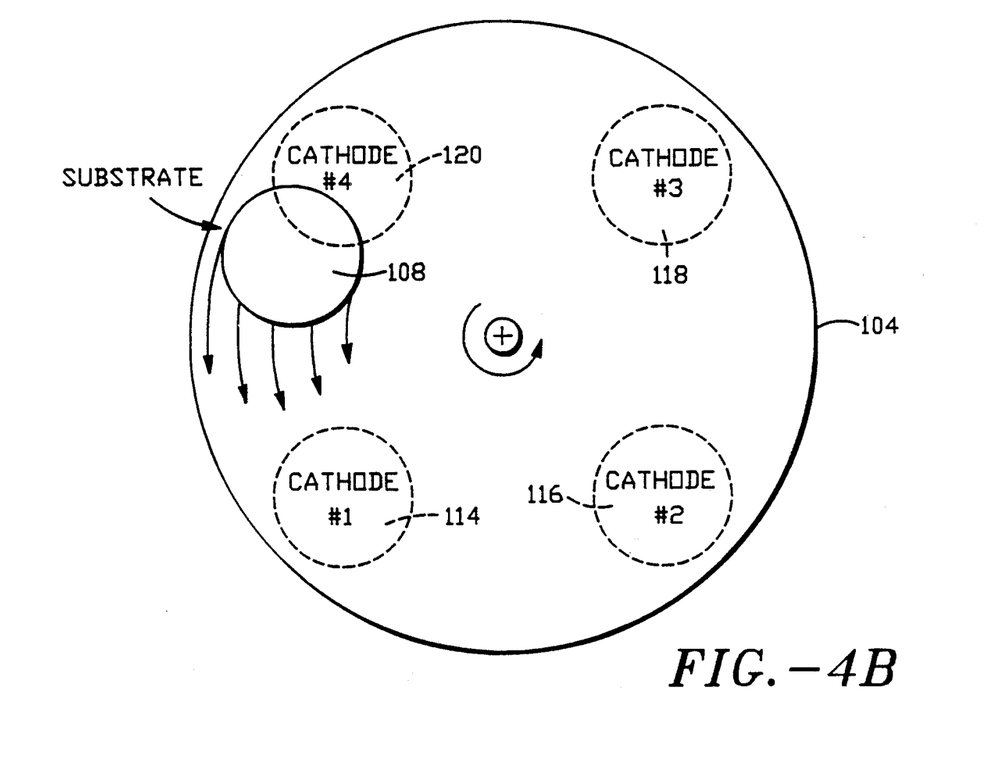
FIG. 4B is a diagrammatic bottom plan view of the substrate wheel of the FIG. 4A apparatus, showing the relative locations of the four cathodes within the chamber to which the substrate is sequentially and repetitively exposed.

Four separate cathode structures 114, 116, 118 and 120 are included in the CVD apparatus 100, as best seen in FIG. 4B. FIG. 4A shows only the first two cathode structures 114 and 116. Each cathode includes a gas conduit 122, insulator 124, electrically negatively biased emitter structure 126 and gas plasma region 128 which includes the substrate 108 when it is in position directly facing the emitter structure 126.

Example for Growing Diamond Films

Diamond films have been grown in a number of low-pressure environments, most notably in a mixture of hydrogen and methane gas at a pressure of 10 to 50 torr in a plasma discharge. Such films are polycrystalline, with faceted crystallites of 0.05 to 1 micron in size which show clear evidence of $sp^3$ bonding by a sharp peak in their raman spectrum at 1332 $cm^{-1}$, characteristic of natural diamond.

While useful as x-ray windows, wear-resistant coatings, and heat sinks, the number of imperfections in such films make them unsuitable for semiconducting devices, and sub-optimal for optical or mechanical applications. In addition, the high temperatures required for deposition (600°-800° C.) and the lack of clear understanding of adhesion mechanisms preclude their use as coatings on polymers, metals or other semiconductors.

The theoretical understanding of diamond film growth is poor, despite considerable work in this field. The relatively high pressure required for film growth (growth has not been reported for gas pressures lower than one torr) suggests that many body collisions are required in the gas phase to form diamond. Also, the high substrate temperature required suggests that surface diffusion mechanisms play a significant role, or that surface reactions which require a significant amount of activation energy are essential. Theories advanced for the formation of diamond suggest a multiple role for atomic hydrogen: as a passivator of the diamond surface, as a creator of surface vacancies (from energetic atoms), and as a reducer of graphitic carbon that forms during some reactions with the methane. Also, the formation of some precursor such as acetylene in the gas phase has been suggested, but not confirmed. In addition, film properties can be improved considerably by the addition of oxygen-containing compounds, such as $O_2$ or CO. To complicate the theoretical picture further, there are claims of generating diamond films from atomic carbon beams, requiring neither hydrogen nor plasma.

In order significantly to improve diamond film quality or to reduce the substrate temperature required for diamond film growth, a better theoretical understanding of the growth mechanism is highly desirable, and a way to vary independently more of the growth parameters is essential. While there is no unanimity in the literature about an appropriate growth mechanism for diamond films, the following sequence of steps is presently preferred:

a) surface passivation by atomic hydrogen;
b) energetic creation of surface vacancies;
c) attachment of a $CH_3$ radical by a single covalent bond; and,
d) formation of two other C—C bonds by reacting hydrogen with oxygen, or by sufficient thermal energy.

The consequence of the foregoing process is set forth schematically in FIG. 5. Therein, graph A shows surface passivation by atomic hydrogen. All C bonds on the surface of the growing film are terminated by covalently bonded hydrogen atoms.

Figure 5A:
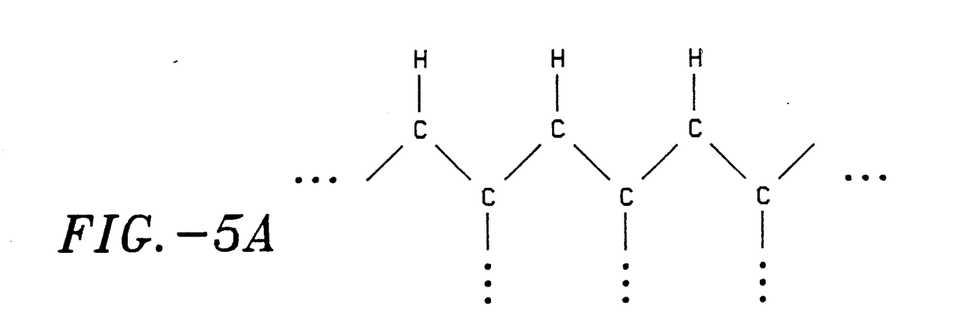
FIG. 5 is a series of four graphs progressively illustrating growth of a diamond film deposition layer of a substrate undergoing sequential continuous vapor deposition processing in accordance with the present invention.
Figure 5B:
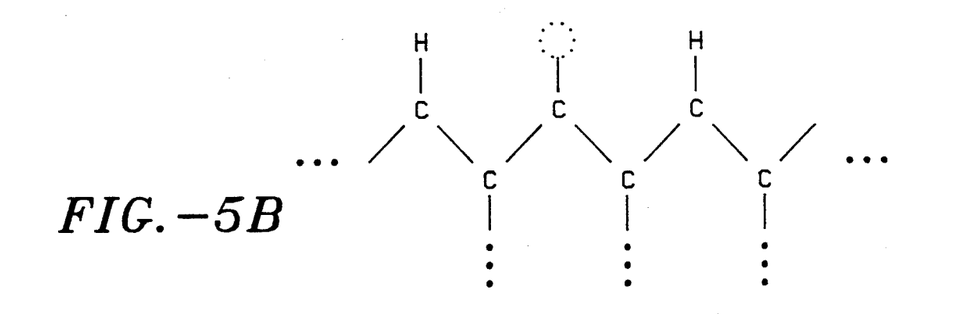

Graph B shows vacancies being created in the passivation layer by energetic atoms in the plasma discharge directed toward the substrate. Such a vacancy is believed to have a high surface mobility.

Figure 5C:
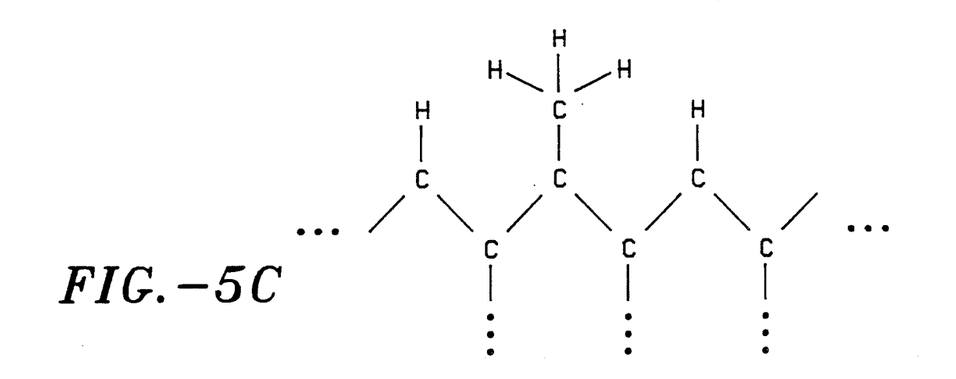

Graph C depicts a methyl group, such as $CH_3$, in an excited or ionic state, covalently bonded at the Graph B vacancy.

Figure 5D:
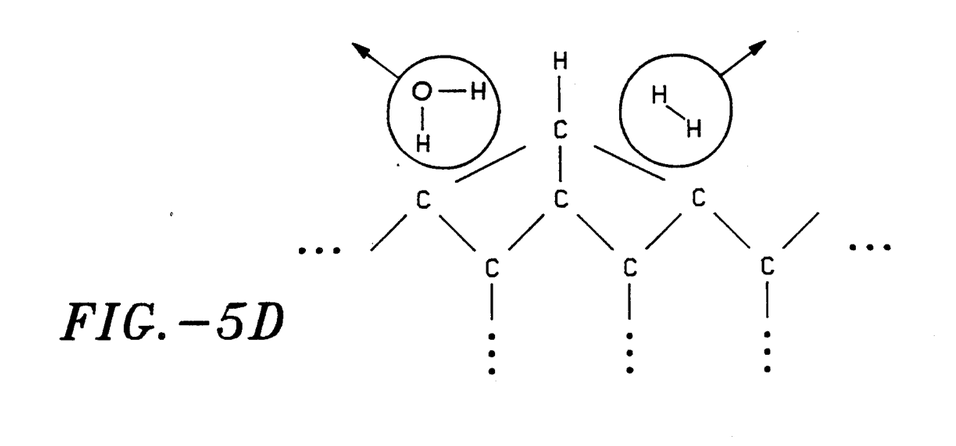

Graph D depicts the development of two C—C bonds between neighboring carbon atoms which releases the four hydrogen atoms, probably as $2*H_2$ or, if oxygen is involved, as $2H_2O$.

In a conventional reactor, atomic hydrogen is produced by a glow discharge, and is reactive enough to passivate any unsatisfied surface bonds on the diamond surface, as depicted in Graph A. In addition, some of the hydrogen atoms/molecules have enough energy to create transient vacancies, as depicted in Graph B. $CH_3$ and other hydrocarbon species are also produced in the plasma, some of which become covalently attached where a vacancy exists, as graphed in Graph C. By applying enough thermal energy or energetic oxygen atoms, other C—C bonds are formed before the attached methyl group is destroyed, releasing $H_2$ or $H_2O$, as graphed in Graph D. This latter step is the one which is believed to require a high substrate temperature with the conventional process.

By using sequential CVD principles of the present invention, conditions relating to each environment may be controlled separately, so that each step of the above process may be independently optimized. For example, the level of hydrogen excitation required to passivate the surface (step a) can be decoupled from the process supplying energy to create the requisite atomic vacancies (step b). The latter can also be independently optimized by using argon ions or some other non-reactive species. Also, unwanted reactions can be minimized (oxygen needed in step d could be prevented from reacting with the hydrogen of step a, for example).

In the sequential CVD reactor 100 illustrated in FIGS. 4A and 4B, diamond films are grown on metals or semiconducting substrates. The four separate plasma environments provided by the four cathode structures 114, 116, 118 and 120. Each cathode emitter 126 is preferably about one inch in diameter. The structures 114, 116, 118 and 120 are separately excited by four direct current discharges supplied by power supplies (not shown in FIG. 4).

In the present example of diamond film generation, the four gas sources are respectively 1) hydrogen gas, 2) argon gas, 3) a mixture of methane and argon gases and 4) a mixture of oxygen and argon gases. The latter two mixtures are quite dilute, consisting of at most a few percent oxygen and methane. The total chamber pressure of the vessel 102 is on the order of 0.001 to 0.01 atmospheres, and the gas flow rates are all about 1 to 10 sccm. The four DC power supplies for creating the four plasmas are operated in the 200–500 volt region, and the substrate plate 104 is rotated by a motor (not shown) at a predetermined angular velocity, in this example preferably about several hundred revolutions per minute.

The gases are supplied through small holes in each cathode emitter 126 at a rate high enough to insure that the gas in the plasma region 128 surrounding each cathode is of the desired composition. The substrate 108 to be coated is mounted on the rotating substrate plate 104 above the cathodes 114, 116, 118 and 120 at a controllable distance, preferably about 0.5 inches. The plate is radially heated from behind by the heaters 110 and 112 to a desired substrate temperature up to about 1000° C. While the plasmas 128 are presently preferably created by a DC discharge between the cathodes and the anode formed by the plate 104, capacitively coupled RF discharges may also be used to reduce the sputtering of cathode material onto the substrate 108.

Gases flowing through the cathodes are ionized by biasing each one negatively with respect to the common anode provided by the wheel plate 104. Thus, one cathode, such as the cathode 114 delivering hydrogen can be operated at a negative potential of several hundred volts to produce highly excited species, while another cathode with oxygen or methane, such as the cathode 118, can be operated at the anode potential so that little ionization occurs.

At vessel pressure usually employed in diamond growth (10-50 torr), the mean free path in the gas is on the order of a micron, so the cathode dark space and negative glow region will be close to the cathode surface. The positive column of the discharge will extend through out much of the rest of the chamber, but will be concentrated in the space between the anode (located around the cathodes) and the cathodes By biasing the substrate to some potential between that of the anode and cathode, the energy of positive or negative species reaching it can be controlled. One can therefore excite species present around each cathode independently and can influence which of these species strikes the substrate 108.

As noted, the substrate plate 104 is rotated at a predetermined rate which is selected to be rapid enough to prevent the previously reacted surface from changing due to contamination or adsorption, typically several hundred RPM. Ideally, the sequence of processes carried out within the reactor 100 will produce one monolayer of diamond film growth upon the substrate 108 for each revolution of the plate 104, giving a diamond film growth rate of about 0.1 micron per minute.

Excited states produced on the substrate surface in one plasma environment will decay many orders of magnitude faster than the transit time from one cathode to another, so one can supply the amount of energy appropriate to the desired reaction at each location.

Several modifications to the apparatus 100 may be made in order to modify its characteristics. For example, since the cathodes 114, 116, 118 and 120 are negatively biased, they will tend not to produce negative ions, except for those formed in the positive column. A different cathode structure, as per FIG. 3, may be substituted for the FIG. 2 structure in order to generate and accelerate negative species or negatively excited neutral species.

Further, because of the short mean-free-path, most atoms and ions reaching the substrate will be of thermal energies. By operating the system at reduced pressures, considerably higher energies can be attained.

Also, particularly if lower pressures are used, it may be desirable to excite the cathodes with RF energy in order to reduce sputtering of the material comprising the cathodes To those skilled in the art many variations and widely differing embodiments of the present invention will be suggested by the foregoing description of preferred embodiments. The descriptions and drawings herein are presented by way of example only and should not be construed as limiting the present invention, the scope of which is more particularly pointed out by the following claims.

What is claimed is:

1. A method for a sequential continuous vapor deposition process comprising a plurality of steps for depositing a predetermined material upon a surface of a substrate mounted for relative movement within a single reactor vessel means between each of a plurality of spaced apart gas emitting means disposed within the single vessel means for separately and continuously emitting predetermined gases at discrete regions of the single reactor vessel means, each region being associated with a said gas emitting means and each gas emitting means communicating with separate exhaust port means for continuously exhausting the said gas emitted by the said gas emitting means from the reactor vessel means, the method comprising the steps of:

isolating each of the plurality of gases within the reactor vessel means by establishing a higher pressure at the region of each of said emission means relative to pressure at the separate exhaust port means such that substantially all the gas flows from each of said emission means to the separate exhaust port means without flowing from a region of one of said emission means to the region of another of said emission means, moving the substrate to pass through a said region of a first one of said plurality of gas emission means for exposing the substrate to a first one of said gases in order to carry out a first step of said vapor deposition process, and moving the substrate to pass through a said region of a second one of said plurality of gas emission means for exposing the substrate to a second one of said gases to carry out a second step of said vapor deposition process, so that said steps of said vapor deposition process are carried out sequentially by moving the substrate among the regions of the plurality of gas emission means.

2. The method set forth in claim 1 wherein the steps of moving the substrate to pass through the regions of the first and second ones of said plurality of gas emission means are carried out by the steps of:

securing the substrate to a substrate transporting means within the single reactor vessel means, and continuously moving the substrate transporting means along a controlled locus lying adjacent to said first and second ones of said plurality of gas emission means within the single reactor vessel means at a predetermined velocity.

3. The method set forth in claim 2 wherein the step of securing the substrate to a substrate transporting means comprises the step of securing the substrate to a rotatable substrate plate means, and the step of continuously moving the substrate transporting means is carried out by rotating the substrate plate means at a predetermined angular velocity.

4. The method set forth in claim 3 wherein the step of rotating the substrate plate means is carried out at a predetermined angular velocity at about thirty revolutions or more per minute.

5. The method set forth in claim 2 wherein the step of continuously moving the substrate transporting means is carried out at a rate of movement related to reactions of the plural gases with the surface of the substrate.

6. The method set forth in claim 1 wherein the plurality of gas emission means is selected so that a sum of exposures provided by movement past said plurality results in growth of an atomic layer of said material.

7. The method set forth in claim 1 wherein the step step of exciting at least one of said emission means by an electrical discharge to produce a plasma means at the surface of the substrate as it moves thereby.

8. The method set forth in claim 1 comprising the step of exciting at least one of said emission means by an electrical discharge to produce a plasma means for directing at least one of a group comprising positively charged ions and excited neutral species of a said gas toward the surface of the substrate as it moves thereby.

9. The method as set forth in claim 1 comprising the step of electrically biasing the substrate relative to a said gas emission means.

10. The method set forth in claim 1 comprising the step of heating the substrate.

11. The method set forth in claim 1 comprising the step of evacuating the single reactor vessel means.

12. The method set forth in claim 1 wherein the gas emitted by a said gas emission means is continuously pumped from said single reactor vessel means via a said exhaust port means associated with the said gas emission means.

13. The method set forth in claim 1 for forming a diamond film material upon the said substrate, and wherein the plurality of gas emission means comprises four gas emission means.

14. The method set forth in claim 13 wherein the gases emitted by the gas emission means are respectively:

a) hydrogen gas;
b) argon gas;
c) a mixture of methane and argon gases; and
d) a mixture of oxygen and argon gases.

15. The method set forth in claim 14 comprising the step of negatively biasing the gas emission means for emitting the hydrogen gas within a plasma discharge.

16. A method for a sequential continuous vapor deposition process comprising a plurality of steps for depositing a predetermined homogeneous material upon a surface of a substrate mounted for relative movement within a single reactor vessel means without any solid material boundaries between each of a plurality of gas emitting means, each disposed at a spatially separated region within the single reactor vessel means for separately and continuously emitting predetermined gases at said separated regions of the single vessel means, the single vessel means including separate exhaust port means for continuously exhausting the said gases emitted by each of the said gas emitting means from the reactor vessel means, the method comprising the steps of:

isolating each of the plurality of gases within the single reactor vessel means by establishing a higher pressure at each region of said emission means relative to pressure at said separate exhaust port means such that substantially all of the gas flows from each of said emission means to the separate exhaust port means without flowing from a said region of one of the emission means to a said region of another of the emission means, and repetitively moving the substrate to pass through the regions of said gas emission means including: 'passing through the region of a first one of said plurality of gas emission means for exposing the substrate to a first one of said gases in order to carry out a first step of said vapor deposition process, and passing through the region of a second one of said plurality of gas emission means for exposing the substrate to a second one of said gases to carry out a second step of said vapor deposition process, so that said steps of said vapor deposition process are carried out sequentially and continuously by repetitively exposing the substrate to the gas in the region of each one of the plurality of gas emission means at a repetition rate faster than one exposure per second.

17. The method set forth in claim 16 wherein the steps of repetitively moving the substrate to pass immediately adjacent to the first and second ones of said plurality of gas emission means are carried out by the steps of:

securing the substrate to a substrate transporting means within the single reactor vessel means, and continuously moving the substrate transporting means along a controlled locus lying adjacent to said first and second ones of said plurality of gas emission means within the single reactor vessel means at a predetermined velocity.

18. The method set forth in claim 17 wherein the step of securing the substrate to a substrate transporting means comprises the step of securing the substrate to a rotatable substrate plate means, and the step of continuously moving the substrate transporting means is carried out by rotating the substrate means at a predetermined angular velocity not slower than thirty revolutions per minute.

19. The method set forth in claim 18 wherein there are at least four separate ones of said plurality of gas emission means and the step or repetitively moving the substrate to pass through the regions of said gas emission means includes the steps of:
    passing through the region of a third one of said plurality of gas emission means and passing through the region of a fourth one of said plurality of gas emission means.

20. The method set forth in claim 16 comprising the further step of applying radiant energy to the substrate at the region of at least one of said plurality of gas emission means.

21. The method set forth in claim 20 wherein the step of applying radiant energy to the substrate at the region of at least one of said plurality of gas emission means comprises the step of adding heat.

22. The method set forth in claim 16 comprising the further step of focusing and directing ionized components of at least one of the said predetermined gases emitted at a said one of the plural gas emission means toward said substrate by positioning a focusing means at the said region of said at least one of the plural gas emission means and applying a focusing potential difference to the said focusing means relative to at least one of the substrate and the said at least one of the plural gas emission means.

* * * * *